United States Patent
Klein et al.

(10) Patent No.: US 7,142,059 B2
(45) Date of Patent: Nov. 28, 2006

(54) AMPLIFIER ARRANGEMENT

(75) Inventors: Axel Klein, München (DE);
Ralf-Rainer Schledz, Zolling (DE);
Marcin Augustyniak, München (DE)

(73) Assignee: Infineon Technology AG, Munich (DE)

( * ) Notice: Subject to any disclaimer, the term of this patent is extended or adjusted under 35 U.S.C. 154(b) by 66 days.

(21) Appl. No.: 10/950,981

(22) Filed: Sep. 27, 2004

(65) Prior Publication Data
US 2005/0104662 A1 May 19, 2005

(30) Foreign Application Priority Data
Sep. 30, 2003 (DE) .................. 103 45 521

(51) Int. Cl.
*H03F 1/14* (2006.01)
(52) U.S. Cl. ............... 330/292; 330/76; 330/282; 330/288
(58) Field of Classification Search ............... 330/76, 330/86, 282, 292, 297, 310
See application file for complete search history.

(56) References Cited

U.S. PATENT DOCUMENTS

| | | | |
|---|---|---|---|
| 4,857,863 A | 8/1989 | Ganger et al. | |
| 5,051,705 A * | 9/1991 | Moghe et al. | 330/282 |
| 6,285,257 B1 * | 9/2001 | Abe et al. | 330/282 |
| 6,630,861 B1 * | 10/2003 | Kawaoka | 330/310 |

OTHER PUBLICATIONS

"CMOS Analog Circuit Design", P. Allen et al., 1987 Oxford University Press, Inc., Chapter 2, pp. 253-269.
"An Improved Frequency Compensation Technique for CMOS Operational Amplifiers", Bhupendra K. Ahuja, IEEE Journal of Solid-State Circuits, vol. SC-18, No. 6, Dec. 1983, pp. 629-633.
"Introduction to CMOS OP-AMPS and Comparators", R. Gregorian, 1999, John Willey & Sons, Chapter 4.4, 4 pgs.

* cited by examiner

*Primary Examiner*—Khanh V. Nguyen
(74) *Attorney, Agent, or Firm*—Eschweiler & Associates, LLC

(57) ABSTRACT

The invention provides an amplifier arrangement which is of multistage design. The output transistor in the output stage has a coupling path between its control input and its controlled path. The coupling path comprises a series circuit comprising a Miller compensation capacitance and a resistance with a controllable resistance value. It is thus possible to ensure stable operation of the amplifier regardless of bias and load conditions while simultaneously reducing the quiescent current drawn.

19 Claims, 3 Drawing Sheets

AMPLIFIER ARRANGEMENT

REFERENCE TO RELATED APPLICATIONS

This application claims the benefit of the priority date of German application DE 103 45 521.3, filed on Sep. 30, 2003, the contents of which are herein incorporated by reference in their entirety.

FIELD OF INVENTION

The present invention relates to an amplifier arrangement.

BACKGROUND OF THE INVENTION

An amplifier arrangement, more particularly an operational amplifier having Miller compensation is described, by way of example, in the printed document from Gregorian Roubik "Introduction to CMOS OP-AMPS and Comparators", John Wiley and Sons, 1999, Chapter 4.4. In such operational amplifiers, however, the problem may arise that unwanted parasitic pole points arise under different load and bias conditions.

If no pole point/zero point compensation is carried out for these pole points, the parasitic pole could be shifted to higher frequencies. However, this disadvantageously results in a higher power requirement. Otherwise, the stability of the amplifier is reduced.

If compensation for the additional parasitic pole is performed at the output, however, for example, using a series circuit comprising the Miller compensation capacitor and a resistor, then the quiescent current can be significantly reduced.

However, stability problems may arise under different load conditions. The stability problems arise particularly disadvantageously if the operational amplifier is in the form of a class AB operational amplifier.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later. The invention may be advantageously employed to provide an amplifier arrangement which may be used as an operational amplifier and which provides a small quiescent current and high stability under various load conditions.

In accordance with one or more aspects of the invention, an amplifier arrangement is provided, comprising an input stage and an output stage with an output transistor, in which the output transistor comprises a control connection, which is connected to an output on the input stage, and a controlled path on which an output of the amplifier arrangement is formed, and in which a coupling path between the control connection and the controlled path of the output transistor is provided which comprises a series circuit comprising a Miller compensation capacitance and a controllable resistance.

The proposed amplifier arrangement makes it possible to overcome the stability problems by virtue of the controllable resistance in the coupling path of the output transistor being able to be used to perform pole point/zero point compensation, for example, if this is required on the basis of the amplifier's load and bias conditions. This means that it is possible to produce an operational amplifier with operating-point-dependent Miller frequency compensation which has a lower power consumption given the same stability.

The controllable resistance in one example is a parallel circuit comprising a resistor with a fixed resistance value and a controllable transistor. In this case, the controlled path of the controllable transistor may be connected in parallel with the fixed value resistor.

A regulating device for actuating the controllable resistance may be provided, which may comprise a reference source to which an input on a comparing circuit is connected. A further input on the comparing circuit is coupled to the output transistor such that the comparing circuit is supplied with a signal which is proportional to the current through the output transistor. In this arrangement, an output on the comparing circuit is coupled to a control input on the controllable resistance.

If the controllable resistance is in the form of a parallel circuit comprising a resistor and a controllable transistor, the control input of the controllable transistor may be coupled to the output of the comparing circuit.

The signal which is proportional to the current through the output transistor may be produced using at least one current mirror which couples the output transistor to the comparing circuit. In this arrangement, the output transistor itself may advantageously serve as input transistor for a current mirror.

In line with one exemplary implementation of the invention, the controllable resistance may additionally comprise a bias transistor whose controlled path is connected in parallel with the controllable resistance. The control input of the bias transistor may have a bias signal applied to it. This means that it is possible to retain the desired, comparatively high conductance of the total controllable resistance even for very large load currents through the output transistor.

The amplifier arrangement may be in the form of an operational amplifier.

In another exemplary implementation of the invention, the amplifier arrangement may be a class AB amplifier, wherein the output stage has a further output transistor. The further output transistor has a control connection which is connected to a further output on the input stage in the amplifier arrangement. In addition, the further output transistor has a controlled path on which the output of the amplifier arrangement is formed. The further output transistor comprises a further coupling path between its control connection and its controlled path. The further coupling path comprises a series circuit comprising a further Miller capacitance and a further controllable resistance.

The further controllable resistance may advantageously be actuated as described above using a regulating device.

The output transistor and the further output transistor in one example are of a complementary conductivity type.

The controlled paths of the output transistor and of the further output transistor in one example form a series circuit.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

The invention is explained in more detail below using a plurality of exemplary embodiments with reference to drawings, in which.

DETAILED DESCRIPTION OF THE INVENTION

Figure 1:
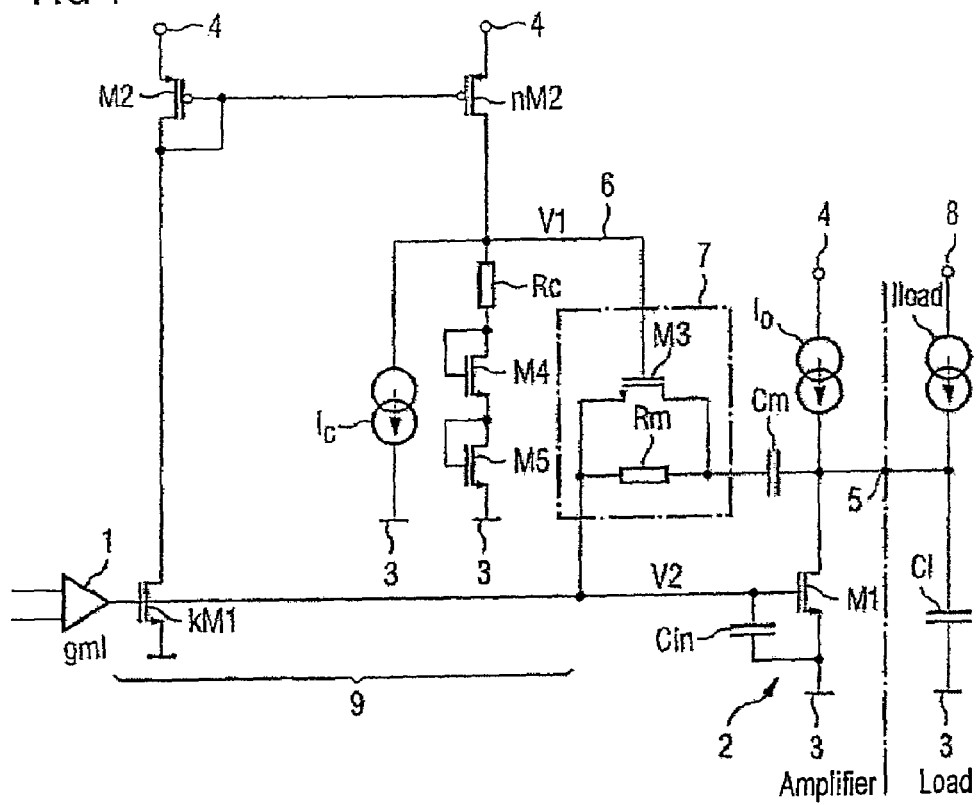
FIG. 1 shows a circuit diagram of an exemplary amplifier arrangement in accordance with one or more aspects of the present invention.

FIG. 1 shows a circuit diagram of an exemplary operational amplifier in accordance with the invention, comprising an input stage 1 and an output stage 2, which is connected downstream of the input stage. The output stage 2 has an output transistor M1 whose control connection, namely its gate connection, is connected to the output of the input stage 1. The controlled source/drain path of the output transistor M1 connects a current source $I_0$ to a reference potential connection 3. A further connection on the current source $I_0$ is connected to a supply potential connection 4. Between the current source $I_0$ and the output transistor M1, the output 5 of the amplifier arrangement is formed. Between the gate connection and the source connection (on the reference potential side) of the output transistor M1, a parasitic gate/source capacitance Cin is shown. To compensate for frequency dependencies caused by the "Miller effect", a Miller capacitance Cm is provided which is connected between the drain connection, that is to say the output 5, and the gate connection of the output transistor M1. In addition, a resistor Rm is provided which forms a series circuit together with the Miller capacitance Cm and is connected between the gate and the drain of the output transistor M1. In this arrangement, the resistor Rm is connected to the gate of the output transistor M1, and the Miller capacitance Cm is connected to its drain. Connected in parallel with the resistor Rm is the controlled source/drain path of a controllable transistor M3. The gate connection of the controllable transistor M3, whose channel represents a resistance with a controllable value, forms a control input 6 for the controllable resistance, which comprises the parallel circuit comprising the resistor Rm and the transistor M3. This total, controllable resistance in series with the Miller capacitance Cm is provided with reference symbol 7.

Connected to the output 5 of the amplifier arrangement is an electrical load. The electrical load comprises a current source Iload which is connected between a supply potential connection 8 and the output 5. In addition, a load capacitance Cl is connected between the output 5 and the reference potential connection 3.

To actuate the controllable resistance 7, there is also a regulating device 9 which comprises two current mirrors. A first current mirror M1, kM1 is formed from the output transistor M1 and a further transistor kM1. The gate connection of the transistor kM1 is connected to the gate connection of the output transistor M1, and the source connection of the transistor kM1 is connected to reference potential connection 3. The drain connection of the transistor kM1 is connected to the drain connection of a transistor M2 which is connected up as a diode. The source connection of the transistor M2, which forms a second current mirror together with a further transistor nM2, is connected to supply potential connection 4. Similarly, the source connection of the transistor nM2 is connected to supply potential connection 4 and the gate connection of the transistor nM2 is connected to the gate connection of the transistor M2 and to the drain connection of the transistor M2. The drain connection of the transistor nM2 is connected to the control connection 6 of the controllable resistance 7.

There is also a current source Ic which is situated between the control input 6 and reference potential connection 3. In addition, a series circuit comprising a resistor Rc and two diodes M4, M5 is connected between the control input 6 and reference potential 3.

The diodes M4, M5 are respectively provided as an n-channel field-effect transistor whose gate connection is connected to the respective drain connection. The transistor M3 in the controllable resistance is also an n-channel transistor. The transistors in the first current mirror M1, kM1 are n-channel transistors, while the transistors M2, nM2 in the second current mirror are p-channel field-effect transistors. All of the transistors are metal oxide semiconductor (MOS) transistors.

The value of the resistance 7 in series with the Miller capacitance Cm is controlled, in accordance with the invention, on the basis of that current which is flowing through the output transistor M1. If the output current is small, then the output pole position shifts to lower frequencies. In this state, the resistance is high and the zero point inserted by this resistance 7 is likewise at a low frequency, which means that it actively compensates for the pole point. If, by contrast, the output current through transistor M1 is large, then the pole point at the output shifts to higher frequencies. Since the resistance value is low in this case, the zero point likewise shifts to higher frequencies. In line with the proposed principle, this means that the advantages such as small quiescent current and hence low power consumption by the overall amplifier can be linked to the high stability of the circuit under various bias and load conditions.

The actuation of the gate connection of the transistor M3 using the regulating device 9 is explained in detail below using the present exemplary embodiment. The current through the controlled path of transistor nM2 is a copy or else reflection of the current through the controlled path of transistor M1, multiplied by the factor k and the factor n. In this case, k represents the transformation ratio or mirror ratio of the first current mirror M1, kM1 and n represents the transformation ratio of the second current mirror M2, nM2. The current through the transistor nM2 is compared with the current which is provided by the current source Ic. If the current through nM2 is larger than the current delivered by current source Ic, the gate voltage on the transistor M3 is equal to zero and transistor M3 has no effect on the circuit. If, in the converse case, however, the current through nM2 is larger than the current delivered by current source Ic, then the gate voltage on the transistor M3 rises continually until it reaches the supply voltage on the supply potential connection 4. The gradient of this rising control voltage at the input 6 is in this case dependent on the resistor Rc and also the gradients gm of the diodes M4 and M5.

In exemplary modifications of the circuit in FIG. 1, the load capacitance Cl may have a series circuit connected in parallel with it which comprises a load resistor and a voltage source and is connected between the output 5 and reference potential connection 3.

The circuit in FIG. 1 may also be implemented as a complementary design within the scope of the invention. For example, instead of the transistors in the circuit in FIG. 1, transistors of complementary conduction type may also be used, that is to say that the n-channel transistors in FIG. 1 may be replaced with p-channel transistors, and the p-channel transistors may be replaced with n-channel transistors.

Figure 2:
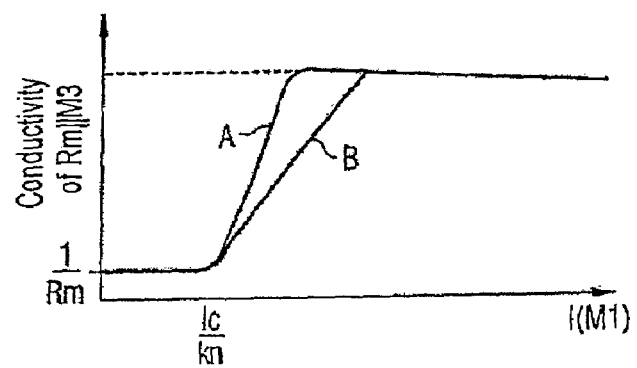
FIG. 2 shows a graphical representation of the conductivity of the controllable resistance as a function of the current through the output transistor for the amplifier arrangement in FIG. 1.

FIG. 2 shows the dependency of the total resistance 7 plotted as conductance over the current I through transistor M1. In this context, Rm denotes the value of the resistor Rm, I(M1) denotes the current through the output transistor M1, Ic denotes the current delivered by current source Ic, and kn denotes the product of the current mirror factors k and n.

By scaling the resistor Rc and the width-to-length ratios of the transistor diodes M4 and M5, it is possible to control the gradient of the curve in FIG. 2. The figure shows two examples, namely a curve A with a relatively steep gradient and a curve B with a shallower gradient.

As compared with the characteristic curve A, the characteristic curve B with a shallower gradient has the property that there is matching between the transistors M1 and M5 and matching between the transistors M3 and M4. In this case, the transistor M5 is (n times k) times smaller than the transistor M1, and also the transistor M4 is (n times k) times smaller than the transistor M3. In addition, resistance Rc is equal to zero. This means that it is possible for the internal transistor conductance gds of the transistor M3 to be proportional to the parameter gm for the transistor M1 when the current I through the transistor M1 changes. The result of this is that the reciprocal of the resistance Rm, namely 1/Rm, is proportional to the parameter gm of the transistor M1. This in turn provides particularly good compensation for pole and zero points.

Figure 3:
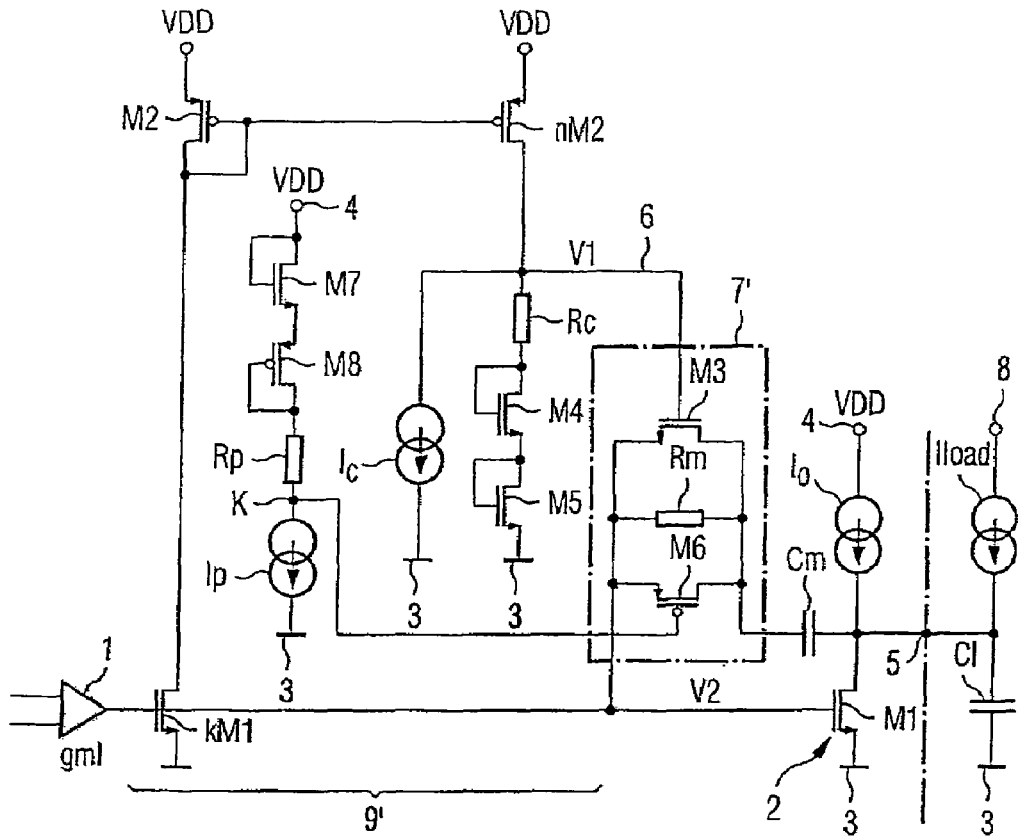
FIG. 3 shows a circuit diagram of another exemplary amplifier arrangement in accordance with the invention.

FIG. 3 shows a development of the exemplary embodiment from FIG. 1. The circuit in FIG. 3 is distinguished from that in FIG. 1 by particularly good suitability for supply voltages of low level and for electrical loads with a small nonreactive resistance component. The circuit in FIG. 3 largely corresponds to that in FIG. 1 in terms of design and advantageous manner of operation and, in view of this, is not described again at this point.

In addition to FIG. 1, FIG. 3 has a transistor M6 which operates as a bias transistor and whose source/drain path is connected in parallel with the resistor Rm and with the transistor M3. The transistor M6 is of complementary conductivity type with regard to transistor M3 and is accordingly in the form of a p-channel MOS field-effect transistor. The gate connection of the bias transistor M6 is connected to a circuit node K at which a bias voltage is provided. The circuit node K is connected to reference potential connection 3 via a current source Ip. In addition, a series circuit comprising a diode M7 and a diode M8 and also a resistor Rp is connected between supply potential connection 4 and circuit node K. The diode M7 is in the form of an n-channel transistor and the diode M8 is in the form of a p-channel transistor with respective connections made.

The total controllable resistance 7' in FIG. 3 accordingly comprises the parallel circuit comprising the fixed value resistor Rm and the controlled paths of the transistors M3, M6.

The additional circuit in FIG. 3 works as follows: the potential on the gate of the bias transistor M6 is calculated from the supply voltage VDD with subtraction of the threshold voltage across transistor M7, of the threshold voltage across M8 and of the product of current through and resistance value of resistor Rp. In this case, the transistor M7 is paired with transistor M3 and the transistor M8 is paired with M6, such that the threshold voltages of these transistors match in each case. It follows from this that the transistor M6 opens when the voltage on its drain/source connection is higher than the supply voltage VDD reduced by the threshold voltage of the transistor M7 and further reduced by the product of the current from the current source Ip multiplied by the resistance value of the resistor Rp. This value is smaller than that voltage at which M3 turns off by the product of the current from the current source Ip multiplied by the resistance value of the resistor Rp. The voltage at which M3 turns off is calculated from the supply voltage VDD reduced by the threshold voltage of the transistor M3.

Figure 4:
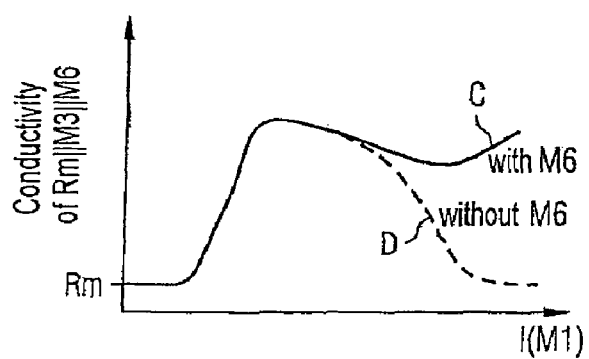
FIG. 4 shows a graphical representation of the conductivity of the controllable resistance as a function of the current through the output transistor based on exemplary amplifier arrangements of FIGS. 1 and 3.

FIG. 4 shows the resultant characteristic curves, which have been plotted as conductivity of the parallel circuit comprising Rm with transistor M3 and bias transistor M6 over the current through output transistor M1. While characteristic curve C has been simulated in the presence of transistor M6, characteristic curve D has been simulated without transistor M6. It is possible to see that when the voltage on the control input 6 approaches supply voltage VDD and M3 is no longer on, it is nevertheless possible to maintain a high level of conductivity. Accordingly, the bias transistor M6 undertakes the conductivity in the range where transistor M3 is no longer able to conduct on account of high output currents.

Figure 5:
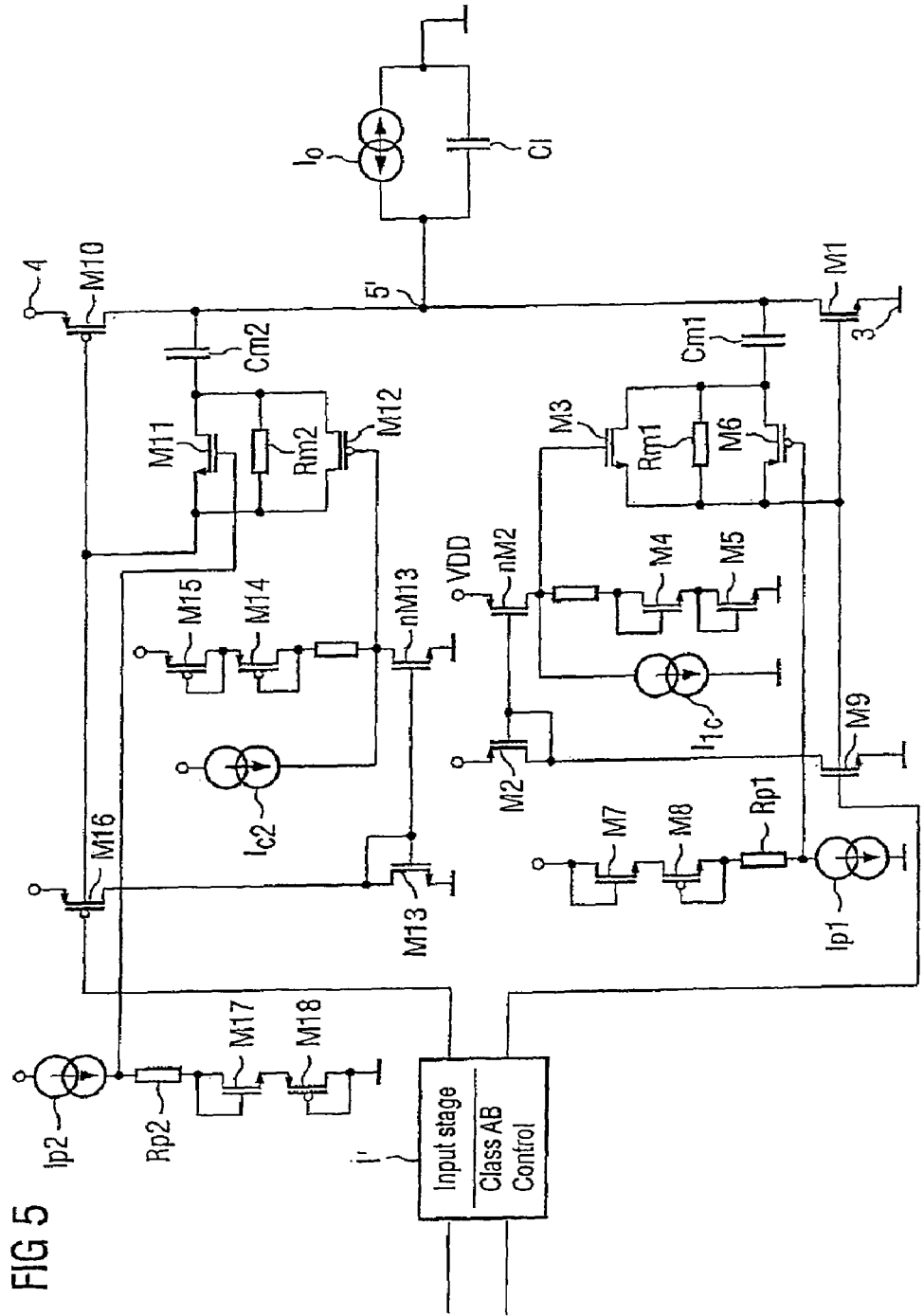
FIG. 5 shows another exemplary implementation of the invention using a circuit diagram of a class AB amplifier.

FIG. 5 shows a further exemplary implementation of an amplifier arrangement based on the proposed principle using the example of a "class AB amplifier". Class AB amplifiers are used as audio amplifiers, for example. A class AB amplifier as shown in FIG. 5 is obtained, in principle, by virtue of double implementation of the circuit in FIG. 3, but with complementary design. In the bottom half of the circuit diagram in FIG. 5, it is possible to see the full circuit from FIG. 3 again. The top half of the figure is designed in a similar manner to this. It is important to note that the controlled paths of the two output transistors M1, M10 form a series circuit between supply potential connection 4 and reference potential connection 3.

In class AB amplifiers such as in FIG. 5, one of the output transistors M1, M10 operates as driver transistor and the other operates as current source. When the direction of the output current changes, they swap their functions. Duplicating the circuit from FIG. 3, in which a circuit is provided for controlling the output transistor of n type and a complementary version of this circuit from FIG. 3 is provided for controlling an output transistor of p-channel type, makes it possible to implement an operating-point-independent frequency compensation scheme in class AB amplifiers. It is possible to see that the transistors for controlling the p-channel output transistor M10 in the circuit in FIG. 5 are each of complementary type with respect to the control circuit for the n-channel output transistor M1. The input stage 1' in the circuit in FIG. 5, whose outputs actuate the gate connections of the output transistors M1, M10, also comprises the control for the class AB principle in addition to the input stage.

The transistors M3 and M6 can be activated only when the output transistor M1 is operating as a driver transistor. If, by contrast, the output transistor M1 is operating as a current source, then the value of the current through the class AB control circuit is determined in the input stage 1' and is small enough for M3 and M6 to remain off. In this case, the class AB control operates either on the basis of a feedback principle or a feed forward principle.

Instead of the two-stage design shown, the amplifier arrangement may also have a three-stage or multistage architecture.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplifier arrangement, comprising:
   an input stage;
   an output stage having an output transistor, the output transistor comprising:
     a control connection, which is connected to an output of the input stage,
     a controlled path on which an output on the amplifier arrangement is formed, and
     a coupling path between the control connection and the controlled path of the output transistor, the coupling path comprising a series circuit, the series circuit comprising:
       a Miller compensation capacitance, and
       a controllable resistance; and
   a regulating device for actuating the controllable resistance, the regulating device comprising:
     an input side coupled to the output transistor and to a reference source; and
     a comparing circuit which is designed to compare a signal which is proportional to the current through the controlled path of the output transistor with a reference signal, the output of the comparing circuit being coupled to a control input on the controllable resistance.

2. The amplifier arrangement of claim 1, wherein the controllable resistance is a parallel circuit comprising a resistor and a controllable transistor.

3. The amplifier arrangement of claim 2, wherein the regulating device comprises at least one current mirror for producing the signal which is proportional to the current through the controlled path of the output transistor, and wherein an input side of the current mirror is coupled to the output transistor.

4. The amplifier arrangement of claim 2, wherein the controllable resistance is connected in parallel with a controlled path of a bias transistor, and wherein a control input of the bias transistor is able to be supplied with a bias signal.

5. The amplifier arrangement of claim 2, wherein the amplifier arrangement is an operational amplifier.

6. The amplifier arrangement of claim 2, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

7. The amplifier arrangement of claim 6, wherein the regulating device comprises at least one current mirror for producing the signal which is proportional to the current through the controlled path of the output transistor, wherein an input side of the current mirror is coupled to the output transistor, wherein the controllable resistance is connected in parallel with a controlled path of a bias transistor, wherein a control input of the bias transistor is able to be supplied with a bias signal, and wherein the amplifier arrangement is an operational amplifier.

8. The amplifier arrangement of claim 1, wherein the regulating device comprises at least one current mirror for producing the signal which is proportional to the current through the controlled path of the output transistor, and wherein an input side of the current mirror is coupled to the output transistor.

9. The amplifier arrangement of claim 8, wherein the controllable resistance is connected in parallel with a controlled path of a bias transistor, wherein a control input of the bias transistor is able to be supplied with a bias signal, wherein the amplifier arrangement is an operational amplifier, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

10. The amplifier arrangement of claim 8, wherein the controllable resistance is connected in parallel with a controlled path of a bias transistor, and wherein a control input of the bias transistor is able to be supplied with a bias signal.

11. The amplifier arrangement of claim 8, wherein the amplifier arrangement is an operational amplifier.

12. The amplifier arrangement of claim 8, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

13. The amplifier arrangement of claim 1, wherein the controllable resistance is connected in parallel with a controlled path of a bias transistor, and wherein a control input of the bias transistor is able to be supplied with a bias signal.

14. The amplifier arrangement of claim 13, wherein the amplifier arrangement is an operational amplifier, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

15. The amplifier arrangement of claim 13, wherein the amplifier arrangement is an operational amplifier.

16. The amplifier arrangement of claim 13, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

17. The amplifier arrangement of claim 1, wherein the amplifier arrangement is an operational amplifier.

18. The amplifier arrangement of claim 17, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

19. The amplifier arrangement of claim 1, wherein the amplifier arrangement is a class AB amplifier, wherein the output stage has a further output transistor, which comprises a control connection, which is connected to a further output of the input stage, and a controlled path on which the output of the amplifier arrangement is formed, and wherein a further coupling path between the control connection and the controlled path of the further output transistor is provided which comprises a series circuit comprising a further Miller capacitance and a further controllable resistance.

* * * * *